US005194701A

United States Patent [19]

Yamada-Scriba

[11] Patent Number: 5,194,701

[45] Date of Patent: Mar. 16, 1993

[54] SPEAKER STRUCTURE

[75] Inventor: Teppi Yamada-Scriba, Tokyo, Japan

[73] Assignee: N.P.L. Ltd., Tokyo, Japan

[21] Appl. No.: 757,765

[22] Filed: Sep. 11, 1991

[51] Int. Cl.[5] ............ H05K 5/00
[52] U.S. Cl. ............ 181/151; 181/199
[58] Field of Search ............ 181/151, 171, 172

[56] References Cited

U.S. PATENT DOCUMENTS

| | | | |
|---|---|---|---|
| 2,315,896 | 4/1943 | Dumas | 181/151 |
| 3,275,100 | 9/1966 | Dunning | 181/151 |
| 3,720,285 | 3/1973 | Russell et al. | 181/151 |
| 3,982,607 | 9/1976 | Evans | 181/151 |
| 4,284,844 | 8/1981 | Belles | 181/151 |
| 4,964,482 | 10/1990 | Meyer | 181/151 |
| 5,056,618 | 10/1991 | Prodan | 181/199 |

FOREIGN PATENT DOCUMENTS

| | | |
|---|---|---|
| 53-161624 | 12/1978 | Japan . |
| 58-23482 | 2/1983 | Japan . |

*Primary Examiner*—Michael L. Gellner
*Assistant Examiner*—Eddie C. Lee
*Attorney, Agent, or Firm*—Nikaido, Marmelstein, Murray & Oram

[57] ABSTRACT

Disclosed is an improved speaker structure having a rigid unit-support member and a sound-intercepting wall. In order to improve the quality of reproduced sound, the sound-intercepting wall is composed of a layer of sound-absorbent material which is applied at least to outer surface of said unit-support member and a soundproof sheet of an acoustic energy-absorbent material which covers up tightly the layer of sound-absorbent material.

7 Claims, 4 Drawing Sheets

SPEAKER STRUCTURE

BACKGROUND OF THE INVENTION

1. Field of the Invention

The present invention relates to a speaker structure, especially relates to a improved speaker structure which can reproduce accurate recorded sound from an electric signal representing the sound by intercepting radiation into the air of resonant sound due to resonance of unit-support member such as a baffle, frame or enclosure type to fix a speaker unit.

2. Description of Related Art

Generally, in selecting a material of a unit-support member regardless of the shape or type such as baffle, frame, or enclosure type, it is required firstly to have high rigidity enough to assure the stable holding of a speaker unit, and secondly to have high inner acoustic loss enough to suppress the resonance of the unit-support member due to acoustic dynamic pressure from the diaphragm or cone of the speaker unit.

However, no material has been known which is to meet such contradictory requirements as above. As materials for unit-support member having a relatively high rigidity, there has been known such materials as metal, ceramics or glass. It has been tried often to make it into honeycomb structure to lighten the weight for reduction of its resonance time when the unit-support member be made of metal. However, such unit-support member inevitably causes a sharp "Q" of resonance. On use of glass or ceramics, it is impossible to lighten the weight and accordingly resonance time is relatively long. Therefore, a piece of resilient material such as rubber is put between the speaker unit and the unit-support member to prevent direct propagation of vibration of the d'aphragm or cone of the speaker unit to the unit-support member. Due to such resilient piece, it is impossible to attain stable and stationary holding of the unit-support member and therefore a clear rising sound may not be obtained.

On the other hand, wood or plastics has been used as acoustic energy-absorbent materials for the unit-support member. These materials "Q" are flat in comparison with the above mentioned materials having a relatively high rigidity, but the unit-support member made of such material will cause heavy and dull resonant sound still because of the nature of late velocity of propagation. Reviewing above it is proved that radical resolution may not be attained by means of only selection of materials.

Any material having a rigidity despite of the degree, from plastics to fine ceramics, will cause a resonance. Such resonance of the unit-support member will inevitably cause significant distortion of reproduced sound from the speaker unit. An attempt of deadening resonance of the unit-support member with lead, rubber or the like has been adopted hitherto as mentioned above. But reproduction sound resulting the deadening method lacks vividness and accompanies heavy and dull sound. That is, such deadening method is insufficient and only have an effect of changing the frequency distortion of the sound wave radiating from the surface of the unit-support member rather than decreasing the total amount of radiating acoustic energy.

There are different proposals to improve the quality of reproduced sound by improvement in structure. For example, as seen from FIG. 5, Japanese Utility Model 58-23482(A) shows a speaker structure using double-walled enclosure as unit-support member having inner and outer walls 101 and 102 each made of metal plate, wood or plastics molding. The double-walled enclosure has a speaker unit 100 around its opening. These inner and outer walls 101 and 102 are separated by cubic spacers 104 to define a space 103 therebetween. The space 103 is filled with liquid, powdered material or any other vibration-attenuating substance. And the inner wall 101 is lined with a sound-absorbent material 105. Also, Japanese Utility Model 53-161624(A) shows a speaker structure having a double-walled enclosure filled with liquid between its inner and outer walls for the purpose of attenuating the vibration of the enclosure.

As may be understood from the above, the filling of a vibration-attenuating material between the inner and outer walls of a double-shelled enclosure is in an attempt of attenuating the vibration caused by the speaker unit in the unit-support member, and accordingly improving the frequency characteristics of sound reproduction. However, the filling of such material cannot prevent the resonance of the unit-support member at a relatively low frequency, and it is insufficient to intercept the resonant sound at a relatively low frequency. Also, as most important problem, the outer wall of the unit-support member directly affixes the speaker unit and the wall is exposed in the atmosphere, and therefore the vibration propagated to the support member from the speaker unit will cause a resonant sound and the sound radiates directly into the atmosphere. Further, they have a disadvantage of making the unit-support member structure complicated because they must be designed to be filled with a vibration-attenuating material. Thus, the structural attempt in the prior art could not bring radical resolution as same as the above by means of selection of materials.

Under the present circumstances as above, the present invention is based on the understanding that any materials to make unit-support member will inevitably cause resonance. Though it is impossible to remove the resonance of unit-support member completely by deadening method, it is possible to shield and intercept the radiation of the resonant sound from the unit-support member into an sound-intercepting wall. Accordingly, the inventor has reached to the idea that the resonant sound will not radiate into the air out of the sound-intercepting wall when the unit-support member is sealed up tightly with the sound-intercepting wall even if the resonant sound be generated and existed therein, and therefore almost of the resonant sound may be removed on auditory sensation.

SUMMARY OF THE INVENTION

The object of the present invention is to provide a speaker structure which can improve substantially the quality of reproduced sound by means of sealing up the unit-support member of a resonant body to cause resonant sound into a sound intercepting wall thereby removing the resonant sound.

To attain this object a speaker structure according to the present invention comprises: a speaker unit; an unit-support member of a relatively high rigid material to which said speaker unit is fixed; and a sound-intercepting wall to shield resonant sound caused by the unit-support member; wherein said sound-intercepting wall being composed of a layer of sound-absorbent material which is applied at least to outer surface of said unit-support member and a soundproof sheet of an acoustic energy-absorbent material which covers up tightly the layer of sound-absorbent material.

Said unit-support member may be an enclosure type structure, a plane baffle type structure formed reversed-"T" shape in lateral view, or a frame type formed like as elongated plate. And the relatively high rigid material to make the unit-support member may be selected preferably from a hard metal such as steel, glass, common ceramics such as porcelain, fine ceramics. Further, said speaker unit may be used any of dynamic speaker unit or flat type speaker unit such as condenser type one et al.

When the unit-support member is an enclosure type one, the rear side of the speaker unit is received in the box-shaped unit-support member, and therefore said sound-intercepting wall can seal up tightly such unit-support member by covering only the outer surface of the unit-support member. Also, the sound in the range of high frequency will not radiate out of the enclosure owing to duct phenomenon and therefore it is unnecessary to consider the possibility of the radiation of resonant sound into the atmosphere through the cone of the speaker unit. Accordingly, the sound-intercepting wall may be formed by covering the unit-support member not only at its whole of inner and outer surface but also at the outer surface only. In case of frame or baffle type structure, the whole surface must be sealed up by the sound-intercepting wall.

Said sound-absorbent material may be glass wool, rock wool or the like. Preferably they should have relatively high density so that sound absorbent ability may be fully shown. Said soundproof sheet must be made of material having a relatively high acoustic inner loss, for example, preferably such as rubber comprising lead powder.

Said unit-support member may have plural legs extending from its bottom to prevent possible resonance of air in a minor space to be formed within the bottom of the speaker body and a floor. Such legs may be sealed up in the sound-intercepting wall. Also the legs may be extended out of the soundproof sheet through as many holes as the legs formed at the bottom of the sheet, which each hole is large enough to leave an annular space around each leg.

In operation assume that a speaker unit is reproducing sound, permitting the reproduced sound to radiate from the front of the speaker unit, and permitting the antiphase sound wave to reach the unit-support member, thereby the unit-support member resonate to generate resonant sound in said sound-intercepting wall. The resonant sound is shut and stayed in the wall never to be audible outside the wall.

As may be understood from the above, the speaker structure of the present invention is so constructed that the unit-support member has relatively high rigidity and the unit-support member is sealed up in the sound-intercepting wall composing of the sound-absorbent layer and the soundproof sheet. Therefore, the speaker structure can effectively silence the resonant sound around the unit-support member in the sound intercepting wall, and free from the adverse effect on the frequency characteristics of the sound reproduced by the speaker unit. Thus, faithful reproduction of the recorded sound can be attained.

Further, the speaker structure become a useful structure applicable to any type of speaker regardless of the type of speaker unit whichever it is a dynamic speaker unit, a flat type speaker unit such as condenser type one or the like, or the type of unit-support member whichever it is enclosure type, plane baffle type, or frame type.

Furthermore, it may have plural legs extending from the bottom of the unit-support member so as to take into the sound-intercepting wall the possible resonance of air in a minor space to be formed within the bottom of the speaker body and a floor. Thus, the influence of the resonance will be removed more exactly.

Other objects and advantages of the present invention will be understood from the following description of preferred embodiments of the present invention, which are shown in accompanying drawings. Same numeral will be assigned to identify the corresponding elements in the plural embodiments.

DESCRIPTION OF THE PREFERRED EMBODIMENTS

Figure 1:
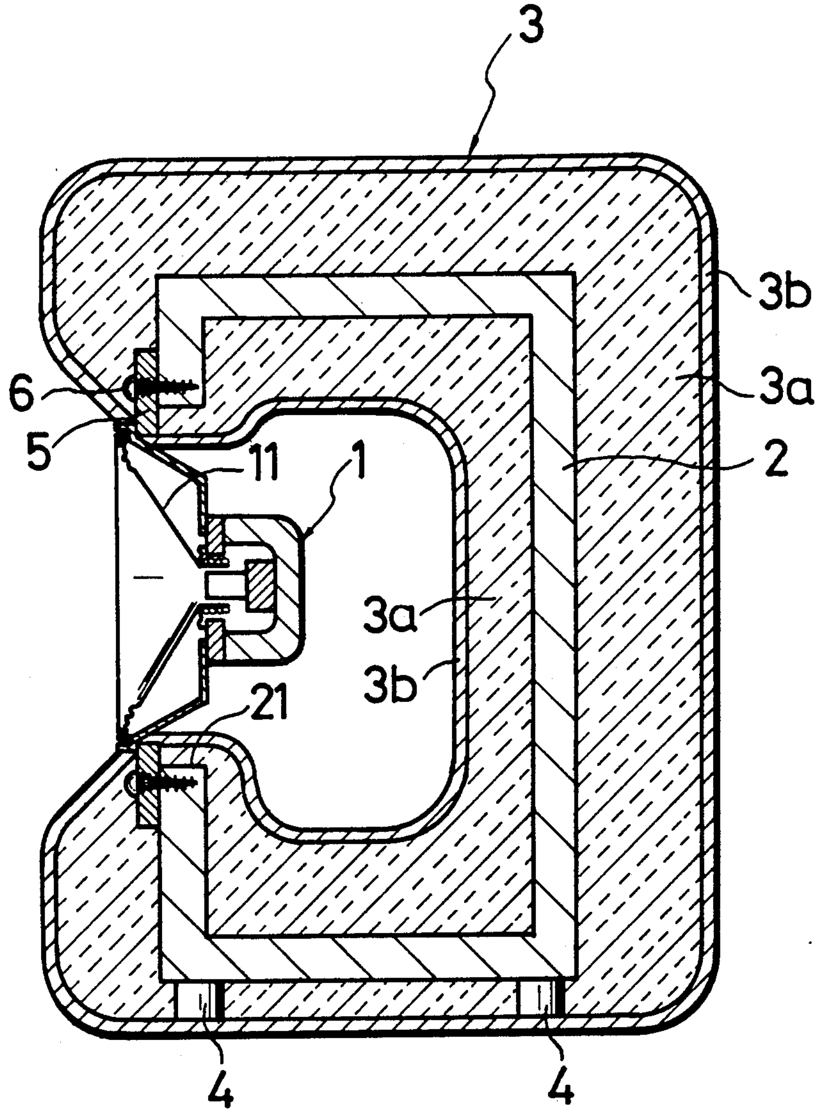
FIG. 1 is a longitudinal section of an enclosure type speaker structure according to one embodiment of the present invention.

Referring to FIG. 1, an enclosure type speaker structure is shown, and the numeral 1 indicates a dynamic speaker unit, 2 is unit-support member of enclosure type, and 3 is sound-intercepting wall to seal up tightly the unit-support member 2.

Said unit-support member 2 is made of fine ceramics in the form of box. An opening 21 is formed at the front side of the unit-support member 2 and the dynamic speaker unit 1 is fixed to the fringe of the opening by screws 6 fastening a unit frame 5 of the speaker unit.

The unit-support member 2 has three legs 4 extending from its bottom and they are received and sealed up in the sound-intercepting wall 3 together with the three legs 4. That is, the structure is all received in the sound-intercepting wall 3 not to be seen from outside other than a cone 11 of the speaker unit 1. The sound-intercepting wall 3 is composed of a sound-absorbent layer 3*a* applied to the whole of inner and outer surface of the unit-support member 2 and a soundproof sheet 3*b* shielded the whole surface of the layer 3*a*. The layer 3*a* is made of glass wool having a relatively high density, and the soundproof sheet 3*b* is made of rubber comprising lead powder.

In such enclosure type speaker structure, resonant sound caused by the unit-support member 2 due to operation of the speaker unit 1 will be absorbed with the sound-absorbent layer 3*a* applied to the surface of the member 2 and be intercepted or insulated exactly the radiation by the sound-proof sheet 3*b* having very flat resonance sharpness "Q". Hereupon, adopting a relatively high density material as said sound-absorbent layer 3*a*, so-called a lagging phenomenon will be attained in which resonant sound caused by a pipe due to fast flow of fluid therein will be silenced by means of lagging around the pipes.

Also, said legs extending from the bottom of the unit-support member enable to cause the resonance of air in the possible minor space to be formed within the bottom of the speaker body and a floor in the sound-intercepting wall but not outside of the wall.

Figure 2:
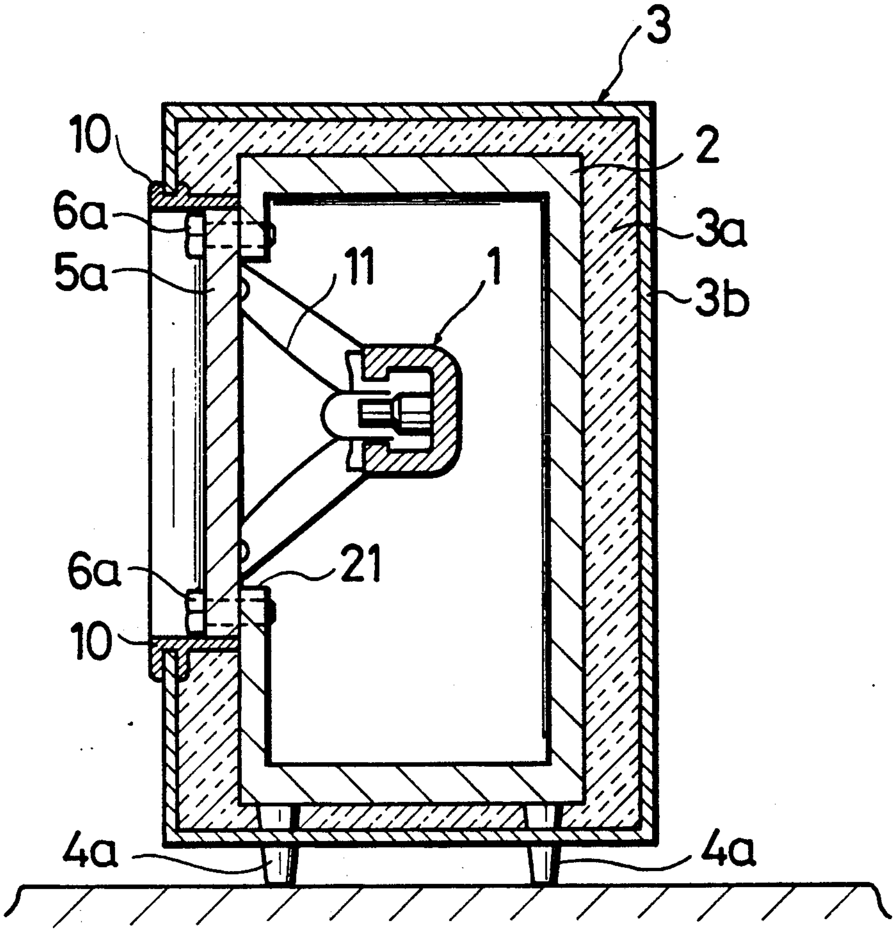
FIG. 2 is a longitudinal section of an enclosure type speaker structure according to another embodiment of the present invention.

Referring FIG. 2, an enclosure type speaker structure according to another embodiment of the present invention comprises a dynamic speaker unit 1, an enclosure type of unit-support member 21, and a sound-intercepting wall 3 to seal up tightly the unit-support member 2.

Said unit-support member 2 is made of fine ceramics in the form of box. An opening 21 is formed at the front side of the unit-support member 2 and the dynamic speaker unit 1 is fixed to the fringe around the opening by small bolts **6*a* fastening a baffle board 5*a*** of the speaker unit.

Said sound-intercepting wall 3 is composed of a sound-absorbent layer **3*a* applied to the whole of outer surface of the unit-support member 2 and a soundproof sheet 3*b* covered the whole surface of the layer 3*a*. The layer 3*a* is made of glass wool having a relatively high density, and the soundproof sheet 3*b* is made of metal comprising lead. This soundproof sheet 3*b* is fixed to the baffle board 5*a* by fixing support 10** of a vibration-deadening material such as polychloroprene.

Figure 2A:
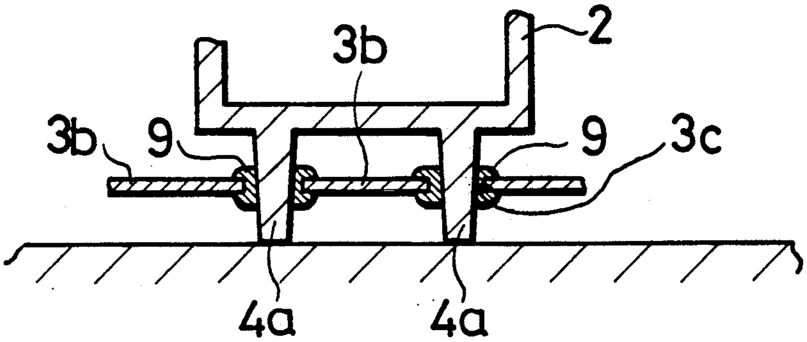
FIG. 2A shows, in section, a part of the speaker structure of FIG. 2.

As seen from FIG. 2A, unit-support member 2 has legs **4*a* extending from its bottom and extending through holes 3*c* of the bottom of soundproof sheet 3*b*. Holes 3*c* are large enough to leave an annular space around each leg 4*a*. Preferably each annular space is filled with rubber 9**.

In this speaker structure, it is confirmed that resonant sound caused due to resonance of the unit-support member 2 will be effectively intercepted by the sound-intercepting wall 3, and thus, faithful reproduction of the recorded sound is attained.

Figure 3:
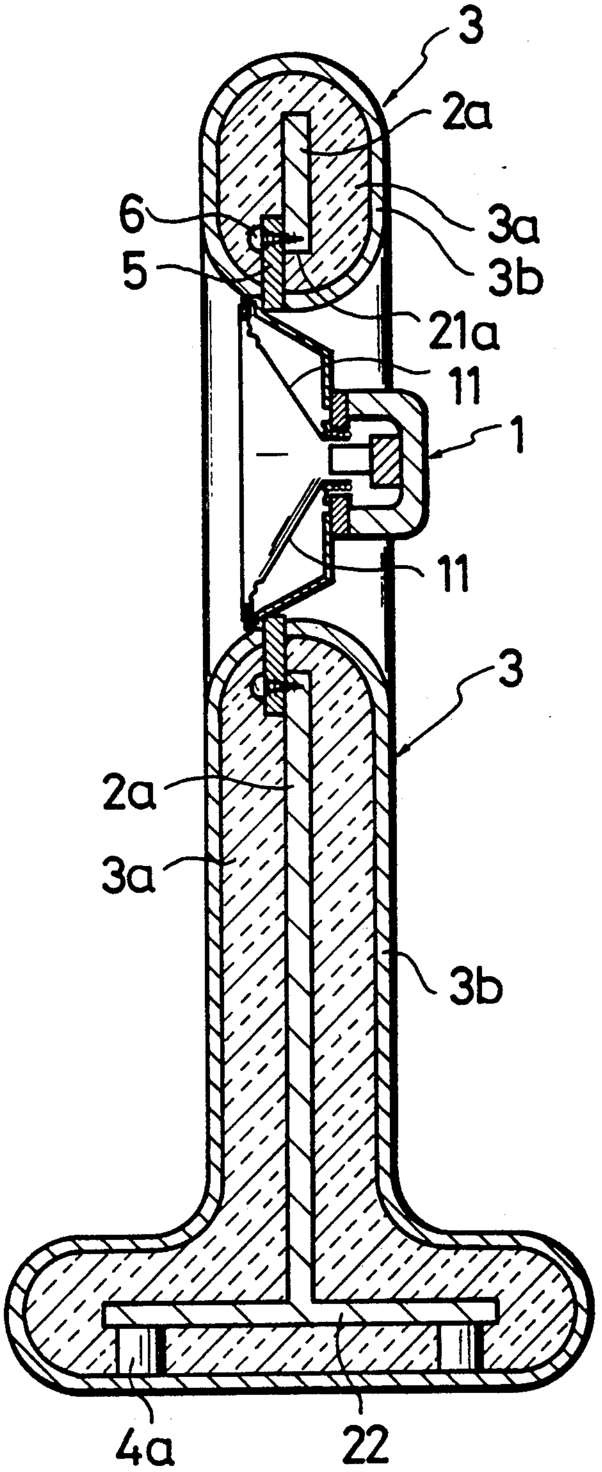
FIG. 3 is a longitudinal section of a flat type speaker structure according to still another embodiment of the present invention.

Referring to FIG. 3, a flat type speaker structure according to still another embodiment of the present invention comprises a dynamic speaker unit 1, a plane baffle type of unit-support member **2*a* and a sound-intercepting wall 3**.

Said plane baffle plate **2*a* is made of fine ceramics in the form of reversed-"T" shape in lateral view. An opening 21*a* is formed at the rather upper side of the vertical plane and the dynamic speaker unit 1 is fixed to the fringe around the opening by screws 6 fastening a unit frame 5** of the speaker unit.

The plane baffle plate **2*a* has legs 4*a* extending from its horizontal bottom plane 22 and it is received and sealed up in the sound-intercepting wall 3 together with the legs 4*a*. That is, the structure is all received in the sound-intercepting wall 3 other than the speaker unit 1. The sound-intercepting wall 3 is composed of a sound-absorbent layer 3*a* applied to the whole of inner and outer surface of the plane baffle plate 2*a* and a soundproof sheet 3*b* shielded the whole surface of the layer 3*a*. The layer 3*a* is made of glass wool having a relatively high density, and the soundproof sheet 3*b*** is made of rubber comprising lead powder.

In such speaker structure, it is confirmed that expected effect is attained and thus, faithful reproduction of the recorded sound is attained.

Figure 4:
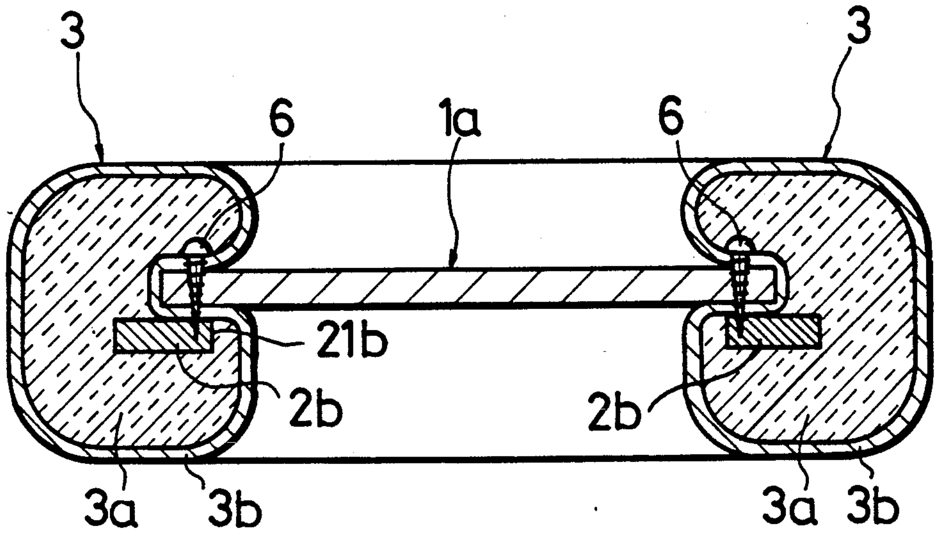
FIG. 4 is a cross section of a flat type speaker structure according to further still another embodiment of the present invention.
Figure 5:
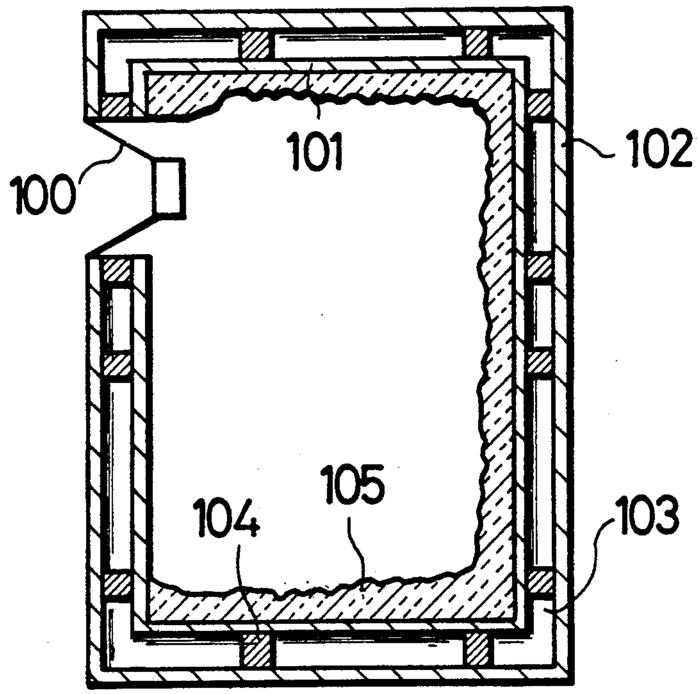
FIG. 5 PRIOR ART
FIG. 5 is a longitudinal section of a conventional speaker structure.

Referring to FIG. 4, a flat type speaker structure according to further still another embodiment of the present invention comprises a condenser type speaker unit **1*a*, a frame type of unit-support member 2*b* and a sound-intercepting wall 3**.

Said frame type of unit-support member **2*b* is made of fine ceramics in the form of elongated plate. An opening 21*b* is formed at the middle of the member 2*b* and the condenser type speaker unit 1*a* is fixed to the fringe around the opening by screws 6. This frame plate 2*b* is completely received and sealed up in the sound-intercepting wall 3. That is, such speaker structure is all received in the sound-intercepting wall 3 other than the speaker unit 1*a***.

Said sound-intercepting wall 3 is composed of a sound-absorbent layer **3*a* applied to the whole of inner and outer surface of the frame plate 2*b* and a soundproof sheet 3*b* shielded the whole surface of the layer 3*a*. The layer 3*a* is made of glass wool having a relatively high density, and the soundproof sheet 3*b*** is made of rubber comprising lead powder.

In such speaker structure, it is confirmed that expected effect is attained and thus, faithful reproduction of the recorded sound is attained without mixture of resonance sound.

The present invention should not be understood to be restrictive to the specific speaker structures described above because various modifications are possible within the spirit of the present invention.

I claim:

1. Speaker structure comprising:
- a speaker unit;
- a unit-support member of a relatively highly rigid material to which said speaker unit is fixed, said unit-support member being a plane baffle type, and having a reverse-T shape in lateral view; and
- a sound-intercepting wall to shield resonant sound caused by the unit-support member, wherein said sound-intercepting wall is composed of a layer of sound-absorbent material which is applied at least to an outer surface of said unit-support member and a soundproof sheet of an acoustic energy-absorbent material which covers the layer of sound-absorbent material.

2. Speaker structure claimed in claim 1, wherein said speaker unit is a dynamic speaker unit.

3. A speaker structure as recited in claim 1, wherein said unit-support member comprises a relatively highly rigid material selected from at least one of a group consisting of steel, glass, porcelain, and ceramics.

4. Speaker structure comprising:
- a speaker unit;
- an unit-support member of a relatively highly rigid material to which said speaker unit is fixed; and
- a sound-intercepting wall to shield resonant sound caused by the unit-support member, wherein said sound-intercepting wall is composed of a layer of sound-absorbent material which is applied at least to an outer surface of said unit-support member and a soundproof sheet of an acoustic energy-absorbent material which covers the layer of sound-absorbent material;
- wherein said unit-support member includes legs extending from a bottom portion thereof, said legs being sealed up in the sound-intercepting wall.

5. Speaker structure claimed in claim 4, wherein said soundproof sheet has as many holes as said legs at a bottom portion thereof, and the legs extend out of the soundproof sheet through the holes which are large enough to leave an annular space around each leg.

6. A speaker structure as recited in claims 4 or 5 wherein said soundproof sheet is made of rubber with lead powder therein.

7. Speaker structure claimed in claim 4 or 5, wherein said unit-support member is an enclosure type one in the form of box.

* * * * *